United States Patent [19]

Nakano et al.

[11] Patent Number: 4,746,563
[45] Date of Patent: May 24, 1988

[54] MULTILAYER COATED CEMENTED CARBIDES

[75] Inventors: Minoru Nakano; Masaaki Tobioka, both of Itami, Japan

[73] Assignee: Sumitomo Electric Industries, Ltd., Osaka, Japan

[21] Appl. No.: 729,973

[22] Filed: May 2, 1985

[30] Foreign Application Priority Data

May 14, 1984 [JP] Japan .................................. 59-94716

[51] Int. Cl.$^4$ ........................ B32B 7/02; B32B 9/00; B24D 3/02; C23C 16/00
[52] U.S. Cl. .................................. 428/216; 428/217; 428/627; 428/698; 428/701; 428/702; 428/908.8; 428/932; 51/309; 427/255.2; 427/255.7
[58] Field of Search ............... 428/702, 701, 699, 698, 428/908.8, 216, 688, 217, 627, 932; 51/295, 297, 309; 501/87, 96; 427/255.2, 255.7

[56] References Cited

U.S. PATENT DOCUMENTS

| | | | |
|---|---|---|---|
| 4,010,583 | 3/1977 | Highberg | 51/297 X |
| 4,052,530 | 10/1977 | Fonzi | 428/698 |
| 4,284,687 | 8/1981 | Dreyer | 428/336 |
| 4,490,191 | 12/1984 | Hale | 428/699 X |

FOREIGN PATENT DOCUMENTS

| | | |
|---|---|---|
| 23608 | 2/1979 | Japan . |
| 26811 | 2/1979 | Japan . |
| 2048960 | 12/1980 | United Kingdom . |

OTHER PUBLICATIONS

English Translation of Japanese Patent Publication 53-45607 (Apr. 24, 1978), 14 p., 1 drawing figure.
Patent Abstracts of Japan, Vol. 6, No. 214 (C-131), [1092] Oct. 27, 1982.
Patent Abstracts of Japan, Vol. 6, No. 214 (C-134), [1105] Nov. 12, 1982.
Patent Abstracts of Japan, Vol. 1, No. 157 p. 3370 C, Dec. 14, 1977.

*Primary Examiner*—John E. Kittle
*Assistant Examiner*—Susan S. Rucker
*Attorney, Agent, or Firm*—Wenderoth, Lind & Ponack

[57] ABSTRACT

Multilayer coated cemented carbides excellent in wear resistance and toughness are provided comprising a substrate of cemented carbide, an inner layer contacted with the surface of the substrate, and an outer layer contacted with the inner layer, the inner layer being a single layer and/or laminated layers consisting of at least one member selected from the group consisting of carbides, nitrides, carbonitrides, carboxynitrides, oxynitrides, boronitrides and borocarbonitrides of Ti, and the outer layer being a multilayer with a total thickness of 5 to 20 $\mu$m, consisting of a plurality of $Al_2O_3$ layer each having a thickness of 0.01 to 2 $\mu$m, each consisting of an $Al_2O_3$ film in which titanium oxide is dissolved or at most 30 vol % of titanium oxide is coexistent and being respectively divided by interlayers each having a thickness of 0.01 to 2 $\mu$m and each consisting of at least one member of the group consisting of TiC, TiN, TiCN, TiCNO, TiNO, Ti oxides Ti(B, N), Ti(B, N, C), SiC, AlN and AlON.

6 Claims, No Drawings

MULTILAYER COATED CEMENTED CARBIDES

BACKGROUND OF THE INVENTION

1. Field of the Invention

This invention relates to coated cemented carbides excellent in wear resistance and toughness and more particularly, it is concerned with multilayer coated cemented carbides suitable for cutting tools which can be used at a high cutting speed, e.g. exceeding 300 m/min for a long period of time.

2. Description of the Prior Art

Cemented carbides coated with one or more layers consisting essentially of at least one of hard materials such as TiC, $Al_2O_3$, TiN, etc. excellent in wear resistance have hitherto been put to practical use. Above all, it is well known that double layer coated cemented carbide tools, whose outer layer is of $Al_2O_3$, have an excellent wear resistance because of the higher heat resistance and oxidation resistance of $Al_2O_3$. Cutting conditions required for such cutting tools have yearly become severer and the requirement of a higher wear resistance for the cutting tools is increasing with the increase of cutting speeds, e.g. exceeding 300 m/min. For this requirement, an effort has been made to increase the thickness of an $Al_2O_3$ layer.

However, $Al_2O_3$ itself is a brittle material, so the increase of its film thickness often results in lowering of the toughness and accordingly, a cutting tool using a cemented carbide coated with an increased thickness of $Al_2O_3$ layer is lacking in toughness so as not to be satisfactory as a widely available tool possessing both the wear resistance and toughness.

SUMMARY OF THE INVENTION

It is an object of the present invention to provide new coated cemented carbides excellent in wear resistance and toughness whereby the above described disadvantages of the prior art can be overcome.

It is another object of the present invention to provide a cemented carbide alloy coated with a multilayer of $Al_2O_3$, which is free from the problem on the decrease of toughness.

These objects can be attained by a multilayer coated cemented carbide comprising a substrate of cemented carbide, an inner layer contacted with the surface of the substrate and an outer layer contacted with the inner layer, the said inner layer being at least one layer consisting essentially of at least one member selected from the group consisting of carbides, nitrides, carbonitrides, carboxynitrides, oxynitrides, boronitrides and borocarbonitrides of Ti, and the said outer layer being a multilayer with a total thickness of 5 to 20 $\mu$m, consisting of a plurality of $Al_2O_3$ layers each having a thickness of 0.01 to 2 $\mu$m, each consisting of an $Al_2O_3$ film in which titanium oxide is dissolved or at most 30 vol % of titanium oxide is coexistent and being respectively divided by interlayers each having a thickness of 0.01 to 2 $\mu$m and each consisting of at least one member selected from the group consisting of TiC, TiN, TiCN, TiCNO, TiCO, TiNO, Ti oxides, Ti(B,N), Ti(B, N, C), SiC, AlN and AlON.

DETAILED DESCRIPTION OF THE INVENTION

The inventors have made efforts to make use the high wear resistance of $Al_2O_3$ layer with an increased thickness without lowering the toughness and consequently, have found that alternate layers of $Al_2O_3$ layers and interlayers are effective for this purpose, each of the $Al_2O_3$ layer containing titanium oxide in the form of a solid solution or mixed crystal. The present invention is based on this finding.

Accordingly, the present invention provides a multilayer coated cemented carbide comprising a substrate of cemented carbide, an inner layer contacted with the surface of the substrate and an outer layer contacted with the inner layer, the said inner layer being at least one layer consisting of at least one member selected from the group consisting of carbides, nitrides, carbonitrides, carboxynitrides, oxynitrides, boronitrides and borocarbonitrides of Ti, and the said outer layer being a multilayer with a total thickness of 5 to 20 $\mu$m, consisting of a plurality of $Al_2O_3$ layers each having a thickness of 0.01 to 2 $\mu$m, each consisting of an $Al_2O_3$ film in which titanium oxide is dissolved or at most 30 vol % of titanium oxide is coexistent and being respectively divided by interlayers each having a thickness of 0.01 to 2 $\mu$m and each consisting of at least one member selected from the group consisting of TiC, TiN, TiCN, TiCNO, TiCO, TiNO, Ti oxides, Ti(B, N), Ti(B, N, C), SiC, AlN and AlON. In a preferred embodiment of the present invention, the above described multilayer of the outer layer has an outermost layer with a thickness of 0.1 to 5 $\mu$m, consisting of at least one member selected from the group consisting of nitrides of Ti, Zr and Hf, BN and AlN.

Effective means for preventing an $Al_2O_3$ coating layer with an increased thickness from lowering the toughness are as follows:

(1) The $Al_2O_3$ coating layer is not composed of pure $Al_2O_3$, but composed of a solid solution of $Al_2O_3$ with titanium oxide or a mixed crystal structure containing 30 vol % or less of titanium oxide.

(2) The $Al_2O_3$ coating layer has a multilayer coating structure comprising $Al_2O_3$ layers having a total thickness of 5 to 20 $\mu$m, each $Al_2O_3$ layer having a thickness of 0.01 to 2 $\mu$m, and divided by interlayers each having a thickness of 0.01 to 2 $\mu$m and each consisting of at least one member selected from the group consisting of TiC, TiCN, TiN, TiCNO, TiCO, TiNO, Ti oxides, Ti(B, N), Ti(B, N, C), SiC, AlN and AlON.

(3) The above described multilayer contains an outermost layer with a thickness of 0.1 to 5 $\mu$m, consisting of at least one member selected from the group consisting of nitrides of Ti, Zr and Hf, BN and AlN.

These three means will be illustrated in detail below:

(1) The wear or abrasion resistance of $Al_2O_3$ is increased with the purity thereof if its grain size is constant, while on the other hand, the toughness is not improved by the purity. However, the inventors have found a method wherein the toughness of $Al_2O_3$ is remarkably increased by somewhat decreasing the wear resistance thereof, that is, by dissolving Ti oxide in $Al_2O_3$ to form generally $(AlTi)_2O_3$. According to this method, the wear resistance is somewhat lowered, but the toughness is remarkably improved. Therefore, the lowering of the wear resistance can be prevented by increasing the film thickness of $Al_2O_3$ without lowering the toughness of a tool as a whole. The Ti present in $Al_2O_3$ in the form of the solid solution or Ti oxides serves to increase the adhesiveness of the $Al_2O_3$ layer to the interlayer provided above or below the $Al_2O_3$ layer.

Ideally, it is desired that Ti oxide is dissolved in $Al_2O_3$ up to the limit of solid solution, preferably in a proportion of 0.01 to 0.1 vol %, but the similar effect can be given even if it is uniformly precipitated with an amount of 30 vol % or less, preferably 10 to 0.1 vol. %. Formation of a solid solution of Ti oxide in $Al_2O_3$ is suitably carried out by a method comprising feeding simultaneously a Ti halide or organo Ti compound during formation of $Al_2O_3$ by chemical vapor deposition.

(2) The formation of a solid solution of Ti oxide in an $Al_2O_3$ film is effective for increasing the toughness of the film, but an increased film thickness results in coarsening of the grain size of $Al_2O_3$ and thus lowering of the wear resistance and toughness. In particular, there is a frequent occurrence of coarse grains or columnar crystals at the edge of a cutter, where the growth speed of $Al_2O_3$ is higher, and the edge part meets with a marked abrasion or breakage. The inventors have made various studies on this problem and have thus found that this problem can be solved by the following structure. That is, the $Al_2O_3$ layer with a total thickness ranging from 5 to 20 $\mu$m is divided into a plurality of layers each having a thickness of 0.01 to 2 $\mu$m by the use of interlayers. Each of the interlayers has a thickness of 0.01 to 2 $\mu$m and consists of at least one member selected from the group consisting of TiC, TiN, TiCN, TiCNO, TiCO, TiNO, Ti oxides, Ti(B, N), Ti(B, N, C), SiC, AlN and AlON. When each of the $Al_2O_3$ layers divided by the interlayers has a thickness of 0.01 to 2 $\mu$m, there takes place no coarsening of grain and thus the wear resistance and toughness can be held. If the thickness exceeds 2 $\mu$m, grain coarsening takes place, while if less than 0.01 $\mu$m, the interlayers above and beneath an $Al_2O_3$ layer tend to be bonded to provide such a state that $Al_2O_3$ grains float in the interlayers. In this case, the toughness is improved but the wear resistance is unfavourably lowered.

If the total thickness of the $Al_2O_3$ layers is less than 5 $\mu$m, increase of the wear resistance is not so expected, while if more than 20 $\mu$m, unfavourable stripping of the films takes place markedly. A preferred range of total film thickness is 5 to 10 $\mu$m. When the wear resistance is not taken into serious consideration, a total thickness of 3 $\mu$m or more can be employed.

The interlayer serves the purpose of not only preventing enlargement of the grain size of $Al_2O_3$, but also forming a composite structure wherein $Al_2O_3$ and the interlayer are dispersed and strengthened each other so as to increase the toughness. That is, the interlayer having a higher strength and toughness than $Al_2O_3$ is capable of intercepting cracks propagating in the $Al_2O_3$ film or reducing the propagation speed thereof and finally preventing cracks from propagation in the interior of the substrate. The thickness of the interlayer should be 0.01 to 2 $\mu$m, since if less than 0.01 $\mu$m, the effect of preventing propagation of cracks cannot be given while if more than 2 $\mu$m, the effects of $Al_2O_3$ is decreased to lower the wear resistance. While the interlayer is formed as a thin film, it is not formed in a laminar structure, but it is occasionally formed in such a structure as is island-dotted in the interface with the $Al_2O_3$ layer. In this structure, the effects or advantages of the present invention can also be obtained.

(3) In a preferred embodiment of the present invention, an outermost layer with a thickness of 0.1 to 5 $\mu$m, consisting of at least one member selected from the group consisting of nitrides of Ti, Zr and Hf, BN and AlN is provided on the outer layer of the $Al_2O_3$ layers divided by the interlayers as set forth above.

Since the coating composed of at least one of Ti, Zr and Hf nitrides, BN and AlN has a high toughness, it is capable of preventing propagation of cracks occurring from the surface or from the coating films to the inside of the substrate or to the surface during cooling or cutting, or reducing the propagation speed thereof, and thereby protecting the cutting tool from an abnormal wearing or chipping due to missing or stripping of the coatings.

When using BN, in particular, coating a hard BN film having an Hv hardness of 3000 kg/mm$^2$ or more with suppressing the film thickness of the lower layers to at most 10 $\mu$m, there can be provided a tool having a higher wear resistance.

As apparent from the foregoing detailed illustration, the multilayer-coated extrahard alloy of the present invention is more excellent in toughness as well as wear or abrasion resistance and is available as a material for a high speed cutter with a much longer life than the prior art alloys.

The following examples are given in order to illustrate the present invention in detail without limiting the same.

EXAMPLE 1

A cemented carbide consisting of 85 wt % of WC, 10 wt % of (Ti, Ta, W)C and 5 wt % of Co was used as a substrate and subjected to a multilayer coating in a CVD apparatus at a temperature of 1000° C. and a reduced pressure of 10 Torr with holding gaseous atmospheres, i.e. a mixed gaseous stream consisting of 5 vol % of $AlCl_3$, 5 vol % of $CO_2$ and the balance of $H_2$ for $Al_2O_3$ layers, a mixed gaseous stream consisting of 5 vol % of $TiCl_4$, 10 vol % of $CH_4$ and the balance of $H_2$ for TiC layers and a mixed gaseous stream consisting of 5 vol % of $TiCl_4$, 10 vol % of $N_2$ and the balance of $H_2$ for TiN layers, and with controlling suitably the reaction time depending on the film thickness, thus obtaining multilayer coated cemented carbides (A), (B) and (C) each having the film thickness structure as shown in Table 1.

When the $Al_2O_3$ layer was formed, 10 vol % of $TiCl_4$ was doped to dissolve Ti in the $Al_2O_3$ or 15 vol % of $TiCl_4$ was doped to precipitate 5 vol % of $Ti_2O_3$ in the $Al_2O_3$.

For comparison, a cemented carbide (D) coated with an inner layer of 3 $\mu$m TiC and an outer layer of 5 $\mu$m $Al_2O_3$ and another cemented carbide (E) coated with an inner layer of 3 $\mu$m TiC and an outer layer of 10 $\mu$m $Al_2O_3$ were prepared.

TABLE 1

| Sample | Inner Layer | Outer Layer | Outermost Layer |
|---|---|---|---|
| A | 3 $\mu$m TiC | 4 laminated layers ($Al_2O_3$ total film thickness 6 $\mu$m) consisting of 1.5 $\mu$m $Al_2O_3$ layers (Ti dissolved) and 0.5 $\mu$m TiC interlayers | 0.5 $\mu$m TiN |
| B | 3 $\mu$m TiC | 12 laminated layers ($Al_2O_3$ total film thickness 6 $\mu$m) consisting of 0.5 $\mu$m $Al_2O$ layers (Ti dissolved) and 0.5 $\mu$m TiO interlayers | 10 $\mu$m TiN |
| C | 3 $\mu$m TiC | 5 laminated layers ($Al_2O_3$ total film thickness 10 $\mu$m) consisting of 2 $\mu$m $Al_2O_3$ layers (coexistent with 5 vol % of $Ti_2O_3$) and 0.1 $\mu$m TiN interlayers | 3 $\mu$m TiN |
| D | 3 $\mu$m TiC | 5 $\mu$m $Al_2O_3$ | |

TABLE 1-continued

| Sample | Inner Layer | Outer Layer | Outermost Layer |
|---|---|---|---|
| E | 3 μm TiC | 10 μm Al$_2$O$_3$ | |

The resulting insert samples (A) to (E) were then subjected to cutting test by the following conditions:
cutting speed 300 m/min
feed 0.30 mm/rev
depth of cut 2 mm
workpiece SCM 435 H (H$_B$ 280)

As a result of this cutting test, Sample A, B and C of the present invention showed cutting times amounting to a flank wear of 0.3 mm of 10, 11 and 18 minutes respectively, while Comparative Sample D was abnormally worn in 1 minute and Comparative Sample E was broken and no good use at the initial stage.

EXAMPLE 2

A cemented carbide consisting of 85 wt % of WC, 5 wt % of (Ti, W)C, 5 wt % of TiN and 5 wt % of Co was used as a substrate (Insert Form: SNMG 432). The flank face side of the insert was of a WC-Co phase in a region of from the surface to a thickness of 20 μm and of three phases of WC, Co and B1 type solid solution in another region inside therefrom. This cemented carbide was coated with an inner layer of 1 μm SiC or TiC, an outer layer comprising 5 laminated layers of Al$_2$O$_3$ (Ti dissolved) with a total thickness of 10 μm, each having a thickness of 2 μm and being divided by interlayers of TiCNO, AlON or Ti(BN) each having a thickness of 0.5 μm, and an outermost layer of 1 μm TiN, ZrN, AlN or BN (hexagonal).

Comparative Samples were prepared by coating the same substrate with an inner layer of 1 μm SiC or TiCN, an outer layer of 10 μm Al$_2$O$_3$ and an outermost layer of 1 μm TiN.

The resulting insert samples were subjected to cutting test in the similar conditions to Example 1 to obtain results as shown in Table 2:

TABLE 2

| Inner Layer | Outer Layer | Outermost Layer | Life (cutting feasible time) (min) |
|---|---|---|---|
| Present Invention | | | |
| 1 μm SiC | 10 μm Al$_2$O$_3$ (Ti dissolved) + TiCNO | 1 μm TiN | 9 |
| " | 10 μm Al$_2$O$_3$ (Ti dissolved) + AlON | " | 8 |
| " | 10 μm Al$_2$O$_3$ (Ti dissolved) + Ti(BN) | " | 11 |
| 1 μm TiC | 10 μm Al$_2$O$_3$ (Ti dissolved) + TiCNO | " | 10 |
| " | 10 μm Al$_2$O$_3$ (Ti dissolved) + Al(ON) | 1 μm ZrN | 9 |
| " | 10 μm Al$_2$O$_3$ (Ti dissolved) + Ti(BN) | 1 μm AlN | 9 |
| " | 10 μm Al$_2$O$_3$ (Ti dissolved) + Ti(BN) | 1 μm BN | 7 |
| Comparison | | | |
| 1 μm SiC | 10 μm Al$_2$O$_3$ | 1 μm TiN | broken in 30 sec. |
| 1 μm TiC | " | " | broken in 1 sec. |

EXAMPLE 3

The cemented carbide alloy of Example 2 was coated with an inner layer of 1 μm TiC, an outer layer with a total Al$_2$O$_3$ film thickness of 5 μm (Ti dissolved) and with interlayers of 0.5 μm TiC and an outermost layer of a hard BN film with an Hv hardness of 3000 kg/mm$^2$ and with a thickness of 3 μm by plasma CVD method, and then subjected to cutting test under the similar conditions to Example 1. The cutting was feasible for 15 minutes.

What is claimed is:

1. A multilayer coated cemented carbide comprising a substrte of cemented carbide, an inner layer contacted with the surface of the substrate and an outer layer contacted with the inner layer, the said inner layer being at least one layer consisting of at least one member selected from the group consisting of carbides, nitrides, carbonitrides, carboxynitrides, oxynitrides, boronitrides and borocarbonitrides of Ti, and the said outer layer being a multilayer with a total thickness of 5 to 20 μm, consisting of a plurality of Al$_2$O$_3$ layers each having a thickness of 0.01 to 2 μm, each consisting of an Al$_2$O$_3$ film in which titanium oxide is dissolved and being respectively divided by interlayers each having a thickness of 0.5 to 2 μm and each consisting of at least one member selected from the group consisting of TiC, TiN, TiCN, TiCNO, TiCO, TiNO, Ti oxides, Ti(B, N), Ti(B, N, C), SiC, AlN and AlON.

2. The multilayer coated cemented carbide of claim 1, wherein the outer layer is further coated with an outermost layer with a thickness of 0.1 to 5 μm, consisting of at least one member selected from the group consisting of nitrides of Ti, Zr and Hf, BN and AlN.

3. The multilayer coated cemented carbide of claim 1, wherein the Al$_2$O$_3$ film containing titanium oxide dissolved or coexistent is prepared by feeding simultaneously a titanium halide or an organo titanium compound when Al$_2$O$_3$ is formed by chemical vapor deposition method.

4. The multilayer coated cemented carbide of claim 2, wherein the outermost layer is a hard BN film with an Hv hardness of at least 3000 kg/mm$^2$.

5. The multilayer coated cemented carbide of claim 1, wherein the titanium oxide is dissolved in the Al$_2$O$_3$ film in a proportion of 0.01 to 0.1 vol % to form a solid solution.

6. The multilayer coated cemented carbide of claim 1, wherein the solid solution is (AlTi)$_2$O$_3$.

* * * * *